United States Patent [19]

Gallagher et al.

[11] Patent Number: 5,434,199
[45] Date of Patent: Jul. 18, 1995

[54] EPOXY MOLDING COMPOSITION FOR SURFACE MOUNT APPLICATIONS

[75] Inventors: Michael K. Gallagher, Lansdale; Michael A. Petti, North Wale, both of Pa.

[73] Assignee: Rohm and Haas Company, Philadelphia, Pa.

[21] Appl. No.: 320,097

[22] Filed: Oct. 7, 1994

Related U.S. Application Data

[63] Continuation of Ser. No. 693,882, May 1, 1991, abandoned.

[51] Int. Cl.$^6$ .................. C08L 63/00; C08F 283/00
[52] U.S. Cl. ............................ 523/400; 523/435; 523/440; 523/443; 525/523; 525/534; 528/88; 428/413; 428/901
[58] Field of Search ............ 523/400, 435, 440, 443; 525/523, 534; 528/88; 428/413, 901

[56] References Cited

U.S. PATENT DOCUMENTS

| | | | |
|---|---|---|---|
| 4,417,006 | 11/1983 | Graziano et al. | 523/435 |
| 4,904,761 | 2/1990 | Okitsu et al. | 525/476 |
| 5,068,267 | 11/1991 | Uchida et al. | 525/65 |
| 5,109,067 | 4/1992 | Dae et al. | 525/101 |
| 5,114,991 | 5/1992 | Ito et al. | 523/436 |
| 5,134,204 | 7/1992 | Toriakai et al. | 525/534 |

FOREIGN PATENT DOCUMENTS

| | | |
|---|---|---|
| 384774 | 8/1990 | European Pat. Off. |
| 2-182747 | 7/1990 | Japan |
| 2-212514 | 8/1990 | Japan |

OTHER PUBLICATIONS

Patent Abstracts of Japan, vol. 14, No. 188 (C-710) & JP-A-2 0 32 117, Feb. 1, 1990.
Patent Abstracts of Japan, vol. 15, No. 80 (C-810) & JP-A-2 2 02 422, Dec. 14, 1990.
Patent Abstracts of Japan, vol. 14, No. 397 (C-752) & JP-A-2 1 47 619, Jun. 6, 1990.
Patent Abstracts of Japan, vol. 13, No. 569 (C-666) & JP-A-212 36 277, Sep. 21, 1989.
Patent Abstracts of Japan, vol. 14, No. 184 (C-709) & JP-A-2 0 29 420, Jan. 31, 1990.

*Primary Examiner*—John C. Bleutge
*Assistant Examiner*—Randy Gulakowski
*Attorney, Agent, or Firm*—Michael B. Fein

[57] ABSTRACT

Epoxy molding compositions for surface mount applications are disclosed. The compositions contain multifunctional epoxy resin and multifunctional hardener along with silicone rubber particles, organofunctional silicone fluid and a high loading of silica.

6 Claims, No Drawings

5,434,199

EPOXY MOLDING COMPOSITION FOR SURFACE MOUNT APPLICATIONS

This application is a continuation of application Ser. No. 07/693,882, filed May 1, 1991, now abandoned.

BACKGROUND OF THE INVENTION

This invention relates to an epoxy molding compound formulation which offers a high degree of reliability and package cracking resistance for surface mount integrated circuits ("IC") packages. Traditionally, integrated circuits ("IC") packages have been encapsulated with a standard epoxy molding compound formulation. Attachment to a circuit board involves inserting the package pins through holes in the circuit board and soldering the protruding pins at very high temperatures (215°–260° C.). The circuit board limits the flow of heat to the encapsulated device; therefore, the package experiences little thermal soldering stress and has a high degree of reliability with respect to package cracking.

Currently, the trend in IC packaging is towards the surface mount type. These packages are not inserted through holes in the board, but rather are mounted directly to the board. These packages are typically thinner than conventional packages; moreover, this surface mount technology allows for packages to be soldered to both sides of a circuit board, thus doubling available space. In this soldering process, the whole package and the circuit board are exposed to the high temperature. This exposure increases the thermal soldering stress experienced by the package; the thinness of these packages in addition to the high temperature they experience greatly increases the probability of package cracking. Any moisture absorbed by the plastic encapsulant exacerbates the package cracking problem. The development of an epoxy molding compound formulation that prevents this solder-induced package cracking, as well as provides the other properties expected from the plastic encapsulant (low stress, good moldability, low ionic, etc.) is needed.

Japanese Patent Application No. 01-276653 discloses a surface mount epoxy encapsulant which contains a multifunctional epoxy, a multifunctional hardener and a liquid silicone rubber.

Japanese Patent Application No. 02-069514 discloses a multifunctional epoxy used in combination with silica particles that are required to be below 3 μm in size.

Japanese Patent Application No. 63-226951 discloses a block-copolymer of novolak-organopolysiloxane, a multifunctional epoxy, a multifunctional hardener and silica.

OBJECTS OF THE INVENTION

It is an object of the present invention to provide an epoxy molding compound formulation with high flexural strength at 215° C. to minimize solder-induced package cracking encountered in surface mount applications and which also provides good low stress properties.

It is also an object of the invention to provide an epoxy molding composition which contains a high loading of silica particles to provide low moisture absorption and reduce the coefficient of thermal expansion of the molding composition, yet which will flow sufficiently under molding conditions.

SUMMARY OF THE INVENTION

In one embodiment this invention provides a low stress epoxy encapsulant composition for surface mount applications. The surface mount epoxy encapsulant contains (A) a multifunctional epoxy resin, 5–15%, (B) a multifunctional phenolic hardener, 2.5–8%, (C) fused silica filler, 70–85%, (D) a silicone rubber powder, 0.25–3%, and (E) a silicone fluid, 0.25–3%. This composition provides low stress properties, resistance to solder-induced package cracking, and low moisture absorbtion.

In another embodiment this invention provides an epoxy molding composition which provides good molding properties with high loadings of silica in a composition.

DESCRIPTION OF THE PREFERRED EMBODIMENTS (A) The epoxy resin used in the invention is of the multifunctional type, preferably trisphenol methane derived resins. The multifunctional resin can be used alone, or in combination with conventional EOCN resins, hydrophobic hydrocarbon epoxy resins, biphenol derived epoxy resins, bisphenol A resins and the like. The multifunctional resin imparts high temperature flexural strength to the composition and reduces solder induced cracking.

(B) The hardener used in the invention is of the multifunctional type, preferably, a trisphenol methane derivative. The resin can be used alone or in combination with conventional phenolic novolac hardeners, hydrophobic hydrocarbon phenolic novolacs, xylok novolaks and the like. The multifunctional hardener imparts high temperature flexural strength and reduces solder-induced cracking.

(C) Fused silica is used in the invention at high weight percent loadings to reduce the moisture absorption of the molding compound formulation and to reduce the coefficient of thermal expansion. The amount of fused silica is generally from about 70% to about 85% by weight of the formulation, preferably from 75 to 85% of the formulation. Loadings of greater than about 79% by weight are most preferred for low moisture absorption, and low coefficient of thermal expansion. The fused silica can be of the crushed angular shape type or spherical shape, or a mixture of the two. Proper selection of size, shape and loading imparts excellent moldability, in addition to low moisture absorption and a low expansion coefficient. The preferred fused silica is a blend of from 65 to 85% spherical silica and from about 35 to 15% crushed silica.

(D) The silicone rubber powder used in the invention is preferably spherical in shape and less than 50 μm in size. The use of the rubber particles is effective in reducing the coefficient of thermal expansion and in reducing the modulus. Crushed angular shaped, >50 μm in size silicone rubbers can be used, but they are not as effective in reducing the coefficient of thermal expansion and the modulus.

(E) The silicone fluid used in the invention is a liquid, preferably containing organofunctional groups. Preferred silicone fluids are those containing both epoxy and polyalkyleneoxy functional groups. These fluids are very effective at reducing the modulus and decreasing the viscosity of the molding compound formulation. Use of fluids containing only one or other functional groups limit the improvements possible in the invention.

METHOD OF PREPARATION OF COMPOSITION

The materials are mixed and blended, for example, in a ball mill, and the blend is optionally compacted for ease of handling. If desired, the blend can be pre-softened or melt-mixed in an extruder. The blend is generally fed by any suitable means, such as a conveyor, to a differential roll mill which comprises a hot roller and a cold roller spaced between one and six millimeters apart along their lengths. This separation is known as the nip. The nip can be adjusted to obtain sheet of the desired dimension.

The differential roll mill may be essentially any such mill known in the art. In general, the rollers of the mill are rotated in opposite directions at different surface velocities about their respective longitudinal axes which are approximately horizontally disposed. In general, the relative rotational speeds of the rollers is at a ratio of between 1.1:1 and 1.3:1, and the rotational speed of the hot roller is generally from about 10 to 30 rpm. The rollers are rotationally mounted by any suitable bearing means to a suitable support.

Examples of such suitable bearing means are roller bearings, ball bearings and sleeve bearings. The support means may be a frame or any structural component attached to a building or the earth. The rollers are rotated by any suitable rotating means, such as an electric motor or a steam engine, connected to a central shaft on the roller by any suitable means such as a chain, a belt or gears. In general, positive drive mechanisms such as chains or gears are preferred.

The surface temperature of the hot roller in general is near the melting temperature of the resin in the blend, i.e., within about 20° C. of the melting temperature of the resin but is at a temperature insufficient to cure the resin within the residence time of the blend on the hot roller of the mill. Usually, the surface temperature of the hot roll is between 65° and 120° C. and is maintained by any suitable heating means or mechanism such as hot water circulating through the hot roller or an electrical heating element. The hot roll temperature may be as high as 130° C. for some special resins.

The following examples are provided to illustrate some embodiments of the invention. They should not be read as limiting the scope of the invention which is more fully described in the specification and claims.

TEST METHODS

Spiral Flow (EMMI) of Epoxy Molding Compounds

This method measures the flow characteristics of thermosets using a transfer molding press equipped with a transfer pot diameter of 1.75" and an EMMI spiral flow mold.

The press platen temperature controllers were set to yield 175°±3° C. mold temperature, and the transfer ram pressure is set to 1000 psia. The transfer ram speed was set in the range of 1 to 4 inches per second. Granular sample was added to the transfer pot to give 0.12 to 0.14 inches cull thickness, and the transfer cycle is activated. The sample is allowed to cure for at least 90 seconds. The mold was opened and the part of the farthest continuous flow was measured. The spiral flow data is reported in the Table row designated "Spiral Flow"; the value reported indicates the inches of flow measured.

Thermomechanical Analysis: Determination

Four cylindrical, molded, postcured pellets (5 mm×5 mm) were annealed in an oven which was heated from 25° C. to 240° C. at a rate of temperature increase of 10° C./minute. After cooling, the expansion curve was measured from 25° C. to 250° C.; at a rate of 10° C./minute. The coefficient of thermal expansion below Tg (CTE) was determined from the slope of a line drawn tangent to the expansion curve before the Tg. The data is reported on the Table in the row designated "CTE"; the value reports ppm/K.

Moisture Absorption

A 2"×⅛" cylindrical disk was molded and postcured. It was removed from the postcure oven and allowed to cure in a desiccator. The sample was then placed in an 85° C./85% Relative Humidity chamber for 168 hours. The disk was removed from the chamber and allowed to cool. The moisture uptake was determined gravimetrically, the moisture absorption is reported in the row designated "Moistr. Abs." as the percent increase in weight. The value was calculated according to the formula $(W_{168}-W_0/W_0)\times 100$, where $W_0$ is the weight at time 0 and $W_{168}$ is the weight at the end of 168 hours in the chamber.

Flexural Properties

A sample of the material was molded to dimensions of 5"×½"×¼" and postcured. The sample was then tested according to ASTM D790 at the temperature of interest to produce the data which is reported in the table below. Flexural Strength at 215° C. ("Flx Str. 215° C." in Table 1) and Room Temperature Flexural Modulus ("RT Flex. Mod" in Table 1) were determined using specimens that were stored in a dessicator prior to measurement. Wet Flexural Strength at 215° C. data ("Wet-Fix 215° C. in Table 1) was determined using specimens that were saturated for 168 hours in an 85° C./85% Relative Humidity chamber prior to measurement. The modulus values are reported in Mpsi and the strength values in psi.

Abbreviation

The following abbreviations have the indicated meanings when they are used in the application.

| | |
|---|---|
| FS762 | crushed fused silica FS762, mean particle size 13.4 μm (supplied by Denki Kagaku Kogyo Kabushiki Kaisha) |
| FB74 | spherical fused silica FB74, mean particle size 31.5 μm (supplied by Denki Kagaku Kogyo Kabushiki Kaisha) |
| FS20 | crushed fused silica FS20, mean particle size 5.6 μm (supplied by Denki Kagaku Kogyo Kabushiki Kaisha) |
| Rubber | spherical silicone rubber AY49-281, particle size distribution 3-30 μm (supplied by Toray/Dow Corning Silicone) |
| Fluid | reactive silicone fluid Q2-8347, (supplied by Dow Corning Corporation) |
| EOCN | epoxy resin ECN 195XL-25, (supplied by Sumitomo Chemical Co., Ltd.) |
| PN | phenolic novolac resin, Tamanol 758 (supplied by Arakawa Chemical Industries) |
| EPPN | epoxy resin EPPN 502H (supplied by Nippon Kayaku Co., Ltd.) |
| MEH | phenolic resin MEH7500 (Meiwa Kasei, KK) |
| BDMA | Benzyldimethylamine (supplied by Aldrich Chemical Company) |
| TPP | Triphenylphosphine (supplied by Aldrich Chemical Company) |
| Dicyand | Dicyandiamide-G (supplied by SKW Trostberg) |
| Sb2O5 | Antimony Pentoxide, Na free Nyacol 1590, (supplied by PQ Corp.) |
| Bis A | tetrabromobisphenol-A BA59P (supplied by Great Lakes Chemical) |
| C Black | Printex Carbon Black (supplied by Degussa |

| | -continued | |
|---|---|---|
| | Corporation) | |
| UL Wax | UL Wax (supplied by Hoechst-Celanese Corporation) | |
| OP Wax - | OP Wax (supplied by Hoechst-Celanese Corporation) | |
| psi | pounds per square inch | |
| PPM | parts per million | | compound was cut 10 times and returned to the mill to improve the mixing.

After the milling was complete, the material was cut from the roll, allowed to cool and granulated. The material was ready for use. The material was either used as is or preformed into pellets prior to use, as stated in the test procedures.

TABLE 1

| Run No. | 1 | 2 | 3 | 4 | 5 | 6 | 7 | 8 | 9 |
|---|---|---|---|---|---|---|---|---|---|
| INGREDIENT | | | | | | | | | |
| FS762 | 75 | 75 | 79 | — | — | — | — | — | — |
| FB74/FS20 | — | — | — | 75 | 75 | 75 | 79 | 79 | 79 |
| Rubber | 1.5 | 1.5 | 1.5 | 0 | 1.5 | 1.5 | 0 | 1.5 | 1.5 |
| Fluid | 1.5 | 1.5 | 1.5 | 1.5 | 0 | 1.5 | 1.5 | 0 | 1.5 |
| EOCN | 12.507 | — | — | — | — | — | — | — | — |
| PN | 6.122 | — | — | — | — | — | — | — | — |
| EPPN | — | 12.248 | 9.617 | 13.399 | 13.399 | 12.413 | 10.768 | 10.768 | 9.781 |
| MEH | — | 6.243 | 4.901 | 6.83 | 6.83 | 6.326 | 5.488 | 5.488 | 4.985 |
| BDMA | 0.003 | 0.003 | 0.003 | 0.003 | 0.003 | 0.003 | 0.003 | 0.003 | 0.003 |
| TPP | 0.171 | 0.127 | 0.099 | 0.139 | 0.139 | 0.128 | 0.111 | 0.111 | 0.101 |
| Dicyand | — | 0.18 | 0.18 | 0.18 | 0.18 | 0.18 | 0.18 | 0.18 | 0.18 |
| Sb2O5 | 1.2 | 1.2 | 1.2 | 1.2 | 1.2 | 1.2 | 1.2 | 1.2 | 1.2 |
| Bis A | 0.9 | 0.9 | 0.9 | 0.9 | 0.9 | 0.9 | 0.9 | 0.9 | 0.9 |
| C Black | 0.2 | 0.2 | 0.2 | 0.2 | 0.2 | 0.2 | 0.2 | 0.2 | 0.2 |
| UL Wax | 0.2 | 0.2 | 0.2 | 0.2 | 0.2 | 0.2 | 0.2 | 0.2 | 0.2 |
| OP Wax | 0.2 | 0.2 | 0.2 | 0.2 | 0.2 | 0.2 | 0.2 | 0.2 | 0.2 |
| PROPERTIES | | | | | | | | | |
| Spiral Flow | 31 | 19 | 11.5 | 39.3 | 30.6 | 29 | 25 | 16.3 | 23.3 |
| RT Flex. Mod | 2.26 | 2.19 | 2.49 | 2.08 | 2.24 | 1.98 | 2.49 | 2.7 | 2.37 |
| Flx Str. 215° C. | 1795 | 6320 | 7380 | 4580 | 5240 | 4900 | 4990 | 6160 | 3840 |
| CTE | 13.3 | 15.7 | 12.9 | 19.9 | 18.6 | 17 | 13.3 | 13.9 | 14.2 |
| Moistr. Abs. | 0.41 | 0.67 | 0.59 | 0.55 | 0.56 | 0.52 | 0.47 | 0.49 | 0.42 |
| WetFlx 215° C. | 1590 | 3050 | 3620 | 2760 | 2810 | 2880 | 3120 | 3290 | 2380 |

FB74/FS20 - is a silica mixture of 80 parts FB74 with 20 parts of FS20.

Experimental Procedure 600 gram batches of experimental samples were prepared according to the following procedure; the amounts of each ingredient are reported in the table as a percent of the total batch. The weight amount in grams of each material can be calculated by multiplying the percentages reported in the table by 600. The silica, the silane and the BDMA were charged to a ceramic ball mill containing alumina grinding media and milled for 15 minutes. The treated silica was removed and the liquid silicone (Q2-8347) was blended with it. The material was recharged to the ball mill along with the other ingredients in the formulation and milled for another 2 hours. The resultant fine powder was dumped from the mill.

The fine powder was processed on a differential two-roll mill in which the front roll was heated, and the back roll was cooled. For example 1, the average temperature on the front roll was 95° C., with no part of the front roll being lower than 90° C. or greater than 100° C. For the other examples, the average temperature on the front roll was 105° C., with no part of the front roll being lower than 100° C. or greater than 110° C. The gap between the rolls was 1.02 millimeter. The material was worked on the mill for two to three minutes after wetout of the filler by the resin was complete. During this two to three minute timeframe, the sheet of molding

We claim:

1. A low stress epoxy molding composition for surface mount integrated circuits comprising:
   a) from about 5% to 15% tris-phenolmethane multifunctional epoxy resin;
   b) from about 2.5% to about 8% tris-phenolmethane multifunctional phenolic hardener;
   c) from about 70 to about 85% fused silica in a blend which includes 65-85% spherical and 35-15% crushed particles;
   d) from about 0.25 to about 3% spherical silicone rubber powder; and
   e) from about 0.25 to about 3% organofunctional silicone fluid.

2. A low stress epoxy molding composition for surface mount integrated circuits according to claim 1 in which the amount of fused silica is at least 75% by weight of the formulation, and the fused silica is a blend of from 65 to 85% spherical silica and from about 35 to 15% crushed silica.

3. A low stress epoxy molding composition according to claim 1 wherein the silicone fluid has both epoxy and polyalkyleneoxy-functional groups.

4. An integrated circuit encapsulated with the composition of claim 1.

5. An integrated circuit encapsulated with the composition of claim 2.

6. An integrated circuit encapsulated with the composition of claim 3.

* * * * *